United States Patent [19]

Edinger et al.

[11] Patent Number: 4,667,403
[45] Date of Patent: May 26, 1987

[54] METHOD FOR MANUFACTURING ELECTRONIC CARD MODULES

[75] Inventors: Egon Edinger, Krailling; Joachim Koetter; Dietmar Kraske, both of Munich; Klaus Krumrey, Speyer; Joerg Mayser, Bruchsal; Ulrich Michael, Stockdorf, all of Fed. Rep. of Germany

[73] Assignee: Siemens Aktiengesellschaft, Berlin and Munich, Fed. Rep. of Germany

[21] Appl. No.: 726,785

[22] Filed: Apr. 24, 1985

[30] Foreign Application Priority Data

May 16, 1984 [DE] Fed. Rep. of Germany ....... 3418210

[51] Int. Cl.⁴ ........................ H05K 3/34; B23Q 46/06
[52] U.S. Cl. .................................... 29/840; 29/564.1; 209/573
[58] Field of Search ....................... 209/571, 573, 574; 29/840, 705, 564, 564.1

[56] References Cited

U.S. PATENT DOCUMENTS

| Re. 25,894 | 11/1965 | McGrath | 209/573 X |
|---|---|---|---|
| 3,264,918 | 8/1966 | Lockart | 209/573 X |
| 3,954,542 | 5/1976 | Solomon et al. | 414/736 X |
| 4,128,174 | 12/1978 | Frisbie et al. | 209/571 X |
| 4,348,276 | 9/1982 | Tateishi et al. | 209/573 |
| 4,498,232 | 2/1985 | Ertl | 209/574 X |

FOREIGN PATENT DOCUMENTS 2910401 9/1980 Fed. Rep. of Germany ...... 209/573

OTHER PUBLICATIONS

Automated Testing for Electronics Manufacturing Conference Sponsored by Electronics Test Paper Titled *Applications of Industrial Robotics to ATE* by L. B. Gardner, Oct. 4–6, 1983.

*Primary Examiner*—Howard N. Goldberg
*Assistant Examiner*—Carl J. Arbes
*Attorney, Agent, or Firm*—Hill, Van Santen, Steadman & Simpson

[57] ABSTRACT

A method and system to produce card modules by assembling and soldering components on a printed circuit board, characterized by retrieving specific printed circuit board-type from a printed circuit board storage having several types in response to a command signal, reading an identification code on the printed circuit board to obtain information concerning the board and then in response to this information, conveying the circuit board through selective processing stations for assembling components on the circuit board, through-stations for soldering the components on the circuit board to form an electronic card module and then through-stations for testing the card module in response to information obtained during reading. The testing station can also include one or more stations for performing the steps of fault-locating and for repairing located faults as necessary.

18 Claims, 5 Drawing Figures

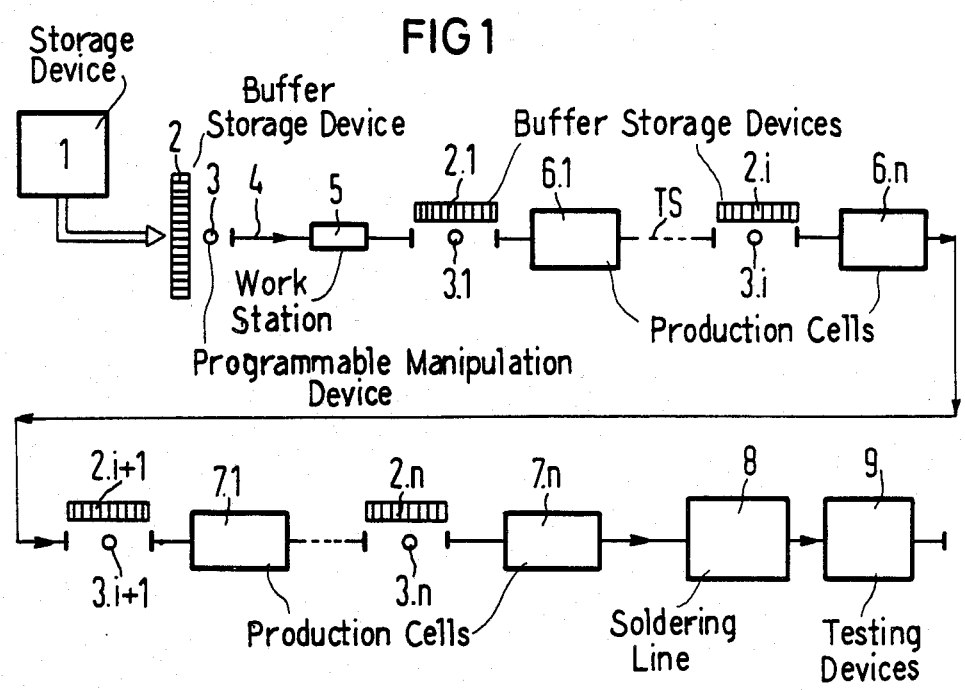

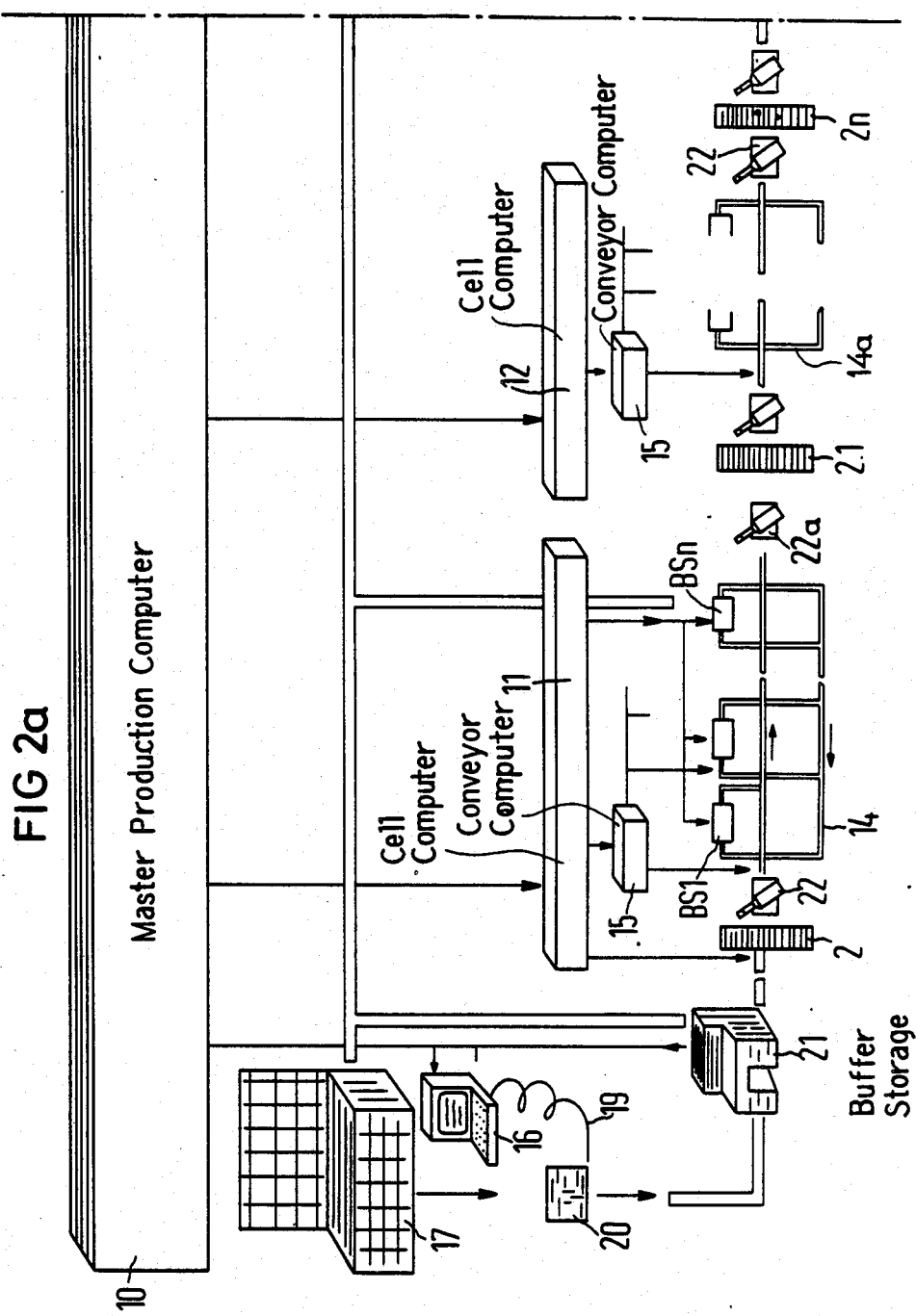

METHOD FOR MANUFACTURING ELECTRONIC CARD MODULES

BACKGROUND OF THE INVENTION

The present invention is directed to a method for automatic assembly and testing components on a printed circuit board to form an electronic card module in which the assembly is accomplished by a program-controlled assembly and testing automats on which the card modules are supplied in the course of the production flow by a mechanical conveyor system.

Reducing inventories and avoiding technically and dispositively caused reassembly or, respectively, rejects, are significant contributions for boosting productivity. This is especially true of the production of electronic systems that are manufactured from a combination of high-grade components. Card module production and testing is the focal point of such operations.

Inventory costs are caused by the number of modules produced during a run, which numbers depend on the run time and by the inventory of the completely tested card modules which cannot yet be called in by a following systems assembly because the type structure is not yet complete. Reassembly and reject costs are caused by card modules, which are no longer required after manufacture due to a modified disposition or, respectively, due to the modules becoming technically obsolete by the time they are needed. The risk is directly related to the overall number of modules produced during each run.

It is known to produce module cards in lots wherein the reason for establishing these lots lies in that the assembly and testing machines must be specifically equipped for the production of a specific type of card module. Supplying the machine with material such as components as well as with the information sets that are defined in the operational sequences are included in the equipping process. Because the setup time is currently relatively high in comparison to the actual manufacturing process, an attempt must be made to produce the greatest number of identical card module types in succession after the exertion of the setup time which establishes the lots. Known card module production devices produce the required spectrum of card module types in large quantities in a cycle of, for example, a number of weeks and supply them to a card module storage from which the following assembly shop can optionally take the card modules. This module storage or buffer storage is necessary in order to keep adequate piece numbers of a specific type of card module on hand because the same type will not be produced again until after a given time span of several weeks has passed.

The lots combine the need of the period of the system assembly, for example, a monthly number. The production and testing facilities must be re-equipped for every lot. One lot is not forwarded to the following production step until the last unit has been processed. The combination of the card modules of the same type is an absolute necessity in order to keep the setup times in a justifiable ratio to the production times. All known activities are concerned with the gradual improvement of the present situation without departing from the fundamental prerequisite of establishing lots. A running, which is time on the order of, for example, two weeks for production of a given type of card module which includes calling in material up to the conclusion of the electrical testing, seems to be a natural lower limit. This value, however, can only be achieved when the lot size is reduced to a limit at which the setup outlay no longer becomes economically justifiable because with a lot size of 15 to 20 items, the setup costs have an exponential increase.

SUMMARY OF THE INVENTION

The present invention is directed to produce card modules in an optimum short run time and only those modules that can be subsequently immediately further processed. The formation of a buffer store and of lots should thereby be avoided.

This object is achieved by a method which includes retrieving a specific printed circuit board-type from a printed circuit board storage having several types in response to a command signal, reading an identification code on the circuit board to obtain information concerning the board, and then in response to the information obtained, conveying the circuit board through selective processing stations for assembling components on the circuit board, for soldering the components on the circuit board to form an electronic card module and then for testing the card module in response to the information obtained during reading, the step of testing including the steps of fault-locating and repairing located faults as necessary.

Other objects and advantages of the present invention will be readily apparent in view of the following drawings, description and claims.

BRIEF DESCRIPTION OF THE DRAWINGS

FIG. 1 is a schematic presentation of an assembly line in accordance with the teachings of the present invention;

FIGS. 2a and 2b are a more detailed schematic presentation showing various steps of the method according to the present invention including retrieving a board from storage, reading the information on the board, conveying the board to various assembly stations, to soldering stations, and to a testing stations;

DESCRIPTION OF THE PREFERRED EMBODIMENTS

Figure 2B:
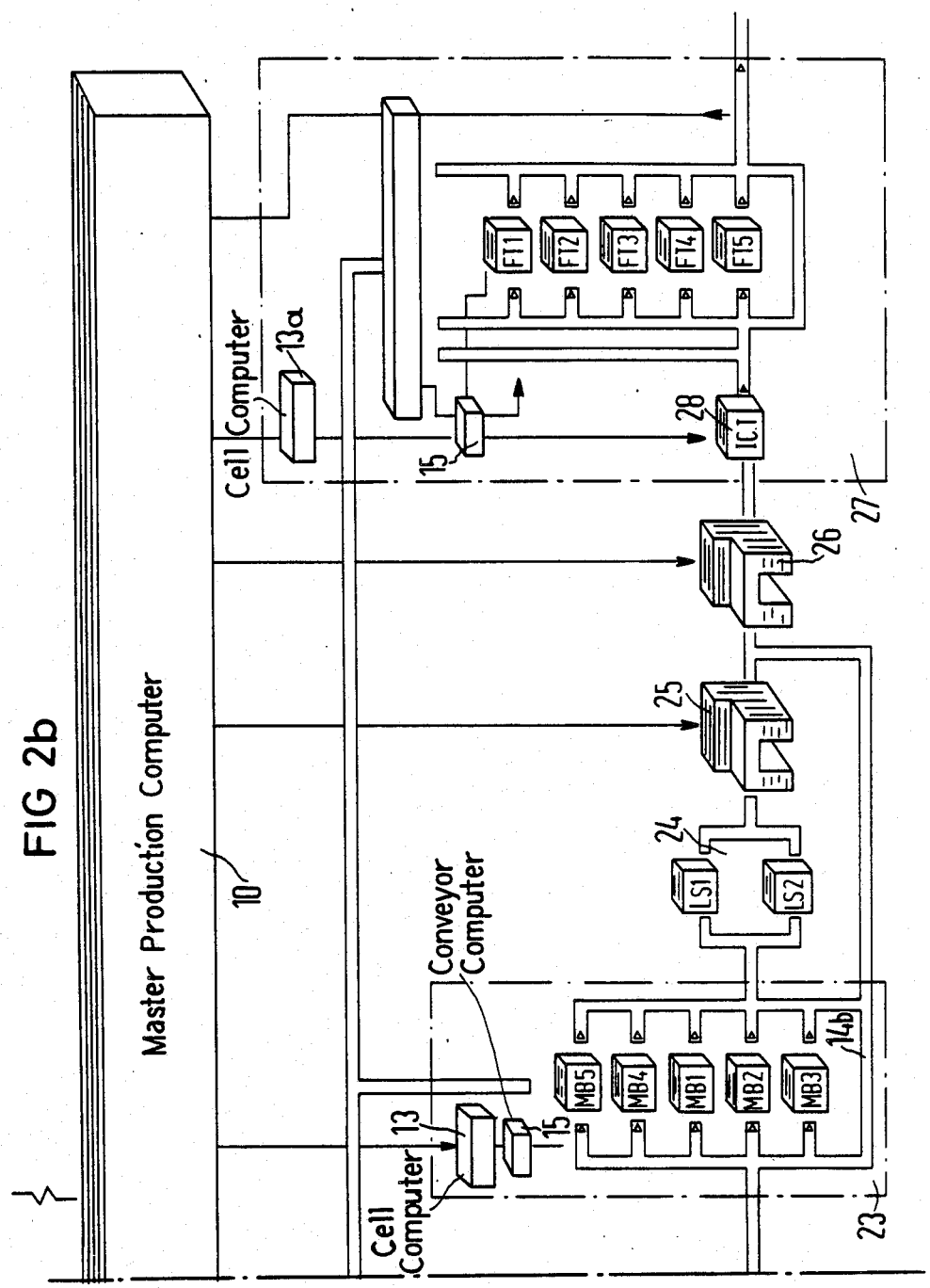

The principles of the present invention are particularly useful when incorporated in a method for processing a printed circuit board by assembling and soldering components thereon to provide or form an electronic card module.

The principles of the method are that from a storage device 1 containing a plurality of different types of printed circuit boards, printed circuit boards of a given type are transferred to an input buffer or buffer storage device 2. The input buffer or storage device 2 is a shelf-like structure having compartments for receiving a plurality of the printed circuit boards. As illustrated in FIG. 1, adjacent to the input buffer store or buffer storage 2, a programmable manipulation device 3 is indicated by a symbol of a circle. The program manipulation device 3 is positioned between the storage 2 and a conveyor belt 4 which proceeds through the entire production line which will be composed of one or more work stations such as 5 at which mechanical parts are applied or assembled onto the board. After passing through the work station 5, the printed circuit board will pass through a plurality of production cells 6.1–6.n for automatic assembly. In addition, the printed circuit board will pass through production cells 7.1–7.n which are constructed for manual assembly steps. Before each of the cells 6.1–6.n and 7.1–7.n, a buffer store or buffer storage device 2.1, 2.i, 2.i +1, 2.n, which has a shelf-like construction, is provided to store a circuit board having completed the previous assembly operations in the previous cell until it is ready to be conveyed into the next following cell. In order to transfer a circuit board from a conveyor system 4 into the buffer store 2.1 and then into a conveyor TS for the cell 6.1, a program manipulating device 3.1 is provided. As illustrated, each of the remaining stores such as 2.i, 2.i +1 and 2.n are provided with program manipulation devices such as 3.i, 3.i +1 and 3.n, respectively.

As illustrated, the last production cell is the cell 7.n. From this production cell, the circuit board with all of the assembled components is then passed to a soldering line 8 and finally to a testing device or area 9.

In the arrangement illustrated in FIG. 1, a plurality or the same type circuit boards can be processed one after another to produce a plurality of the same type of electronic card modules. In the embodiment illustrated in FIGS. 2a and 2b, different circuit boards can be processed one after another to produce different electronic modules. In order for this to occur, the apparatus includes a master production computer 10 which assumes the coordination and management of the overall production process beginning with the feed of printed circuit boards into the production line and continues this control up to the delivery of the finished and tested board and under given conditions repaired card modules from the end of the production line. Each of the production cells such as the cells 6.1 and 6.2 as well as the production cells 7.1 and 7.2 are provided with separate cell computers, such as 11, 12 and 13. All of these computers manage the processing of the printed circuit board through the special assemblies processes which occur in that particular cell. These assembly processes can be the utilization of special machines for equipping the printed circuit boards with DIP components in contrast to assembly machines that can equip the circuit board with axial or radial components. Within each of the cells, a conveyor system 14 of conveyor belts and robots are provided and are controlled by a separate conveyor computer 15 which insures the movement of each of the printed circuit boards through the cell in the desired sequence of steps. For this purpose, the respective conveyor computer 15 receives article-associated conveying requests from their associated cell computer and report the completion of the conveying movement back to the associated cell computers 11–13.

Figure 3:
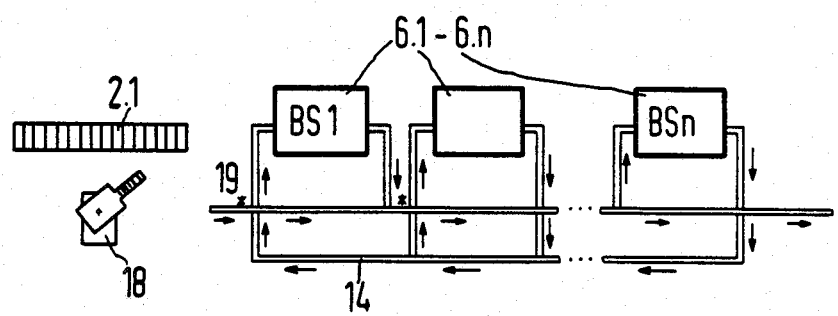
FIG. 3 is another presentation of a production cell utilized in the illustration of FIG. 2.

The master production computer 10 initiates the charging of the overall card modules or printed circuit board production line in that it successively determines the removal of a specific type of printed circuit board 20 from a printed circuit board storage 17. As illustrated, this is done either manually or automatically. For example, the computer 10 can provide information on a terminal 16 which has a picture screen. From this information, an operator makes a manual removal of the type of board 20 from the storage 17. It is also possible that instead of providing the information on the terminal 16 to utilize a robot 18 as illustrated in FIG. 3 which can be used to remove the specific boards 20 from the storage 17. To unequivocally identify the individual printed circuit board unit 20, a read or pen means 19 which as illustrated is a manually actuated reader which will read an identification code such as a bar code provided on the circuit board is used. While this is illustrated as being done by a read pen, a fully automatic or socalled scanner can also be utilized.

In a first processing station 21, the printed circuit board is, for example, provided with a plug strip and in the present case the bar code label which is only provisionally situated on the printed circuit board is placed at a specific and definite location on the printed circuit board, for example, on the plug strip. Subsequent control features are used by the information contained on this identification code. From the station 21, each printed circuit board with the plug strip and the identification code is placed in a buffer storage 2.

A robot or mechanical handling device 22 removes the selected printed circuit boards out of the buffer storage 2 and transfers them to a conveyor system 14 for the first cell which is controlled by the cell computer 11. As illustrated, the first cell has a plurality of assembly stations BS1–BSn. The board is conducted between each of these assembly stations with the desired component being automatically assembled thereon. At the end of all of the assembly operations for the particular board, the board with the components is then taken from the conveyor 14 by a mechanical handling device or robot 22a at the end and placed in a buffer store 2.1 for the next cell.

The next cell which is controlled by the cell computer 12 is basically the same or similar to the first cell and has a conveyor 14a and various assembly stations. After passing through one or more automatic assembly stations in the cell, the robot 22b associated with the output end of the conveyor 14a transfers the board to a buffer store 2n.

In the next step, a cell 23 (FIG. 2b) for performing manual assembly steps has a plurality of manual assembly locations MB1-MB5 and a conveyor system 14b. From the store 2n, the printed circuits are transferred to the conveyor 14 for the manual assembly cell 23 and are conducted to the various manual assembly stations in response to control signals from the conveyor computer 15 which is controlled by a cell computer 13.

Following the manual assembly cell 23, a soldering device 24, which is illustrated as having soldering stations LS1 and LS2 then receives the printed circuit with the components assembled thereon to preform a soldering operation to secure the components to the printed circuit board. Following the soldering device 24, the soldered circuit boards which are now modules, pass through a visual inspection station 25 and then to a PROM firing station 26. After going through the firing station 26, they are conveyed into a last cell 27 which is a cell for testing and repair.

The cell 27, which is controlled by a cell computer 13a. has a testing station or cell 28 which is followed by function testing stations FT1–FT5 and are linked by a conveyor that has its own conveyor computer 15. Of course, the shown testing stations FT1–FT5 and the assembly stations MB1-MB5 are not limited to those specific numbers as illustrated.

A special characteristic of the testing and repair cell 27 is a special fault-locating and repair station which, however can also be divided into a plurality of substations. The cell computer 13a cooperates with the conveyor computer 15 to supply the test stations with the various test programs.

In order for a circuit board to move between a plurality of assembly stations such as BS1 in an assembly cell 6.1, a plurality of read devices 19a are provided as illustrated in FIG. 3. Each of the read devices 19a are located to read the board moving on the conveyor and in view of the information obtained, switches in the conveyor are actuated to either pass the board to the assembly station BS1 or to bypass the station. As illustrated, it is possible that after bypassing a station to convey the board back to the bypassed station at a later time if necessary. Thus, for the particular arrangement, the assembly or a component in one station such as BSn could be before an assembly of a component at the station BS1.

Figure 4:
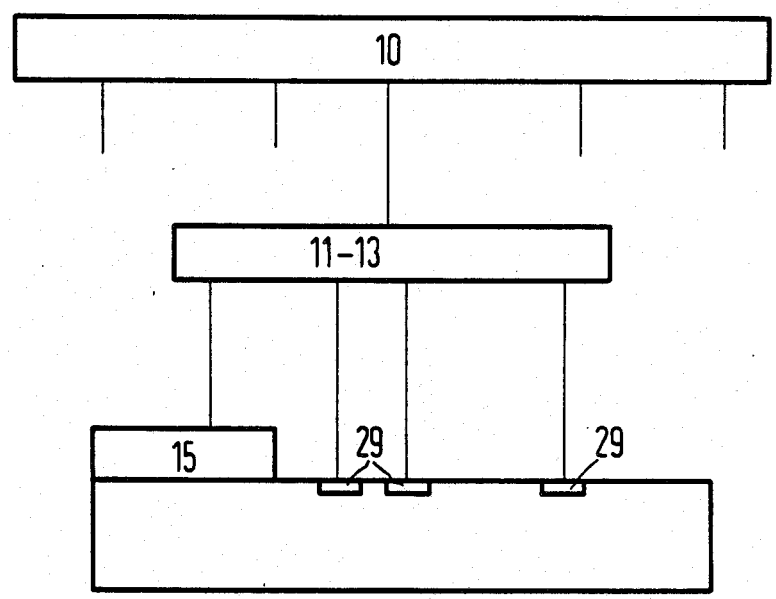
FIG. 4 is a schematic presentation showing the role of the various computers in the proposed system.

As mentioned hereinabove, a master computer 10 controls the operation of each of the cell computers such as 11, 12, 13 and 13a. Each of the cell computers such as 11–13 controls the individual conveyor computer 15 for the cell and any individual computer or microprocessor such as 29 associated with an individual processing station. This arrangement is schematically illustrated in FIG. 4.

The system structure shall be described with reference to FIG. 1. A plurality of printed circuit boards are taken from the storage device 1 with the number and type being predetermined and being, for example, a daily production for the following assembly devices. These boards are deposited in a buffer storage device or shelf 2 situated in front of the production line according to their identification number. The spatial position of each of the printed circuit boards in this storage device is provided to a cell computer during filing and is stored therein. A freely programmable manipulator device 3, which may be a robot, can remove the printed circuit board in an arbitrary sequence from the shelf-like input buffer storage device 2. This "random access" within the prescribed daily quota enables a typeoriented, chronologically matched charging of the conveyor system 4 and every printed circuit board is individually transferred through the overall card module production system which includes assembling, soldering and testing station, in a special workpiece carrier. The sequence of the charging is continuously redetermined as a function of the current status of the shelf contents of the storage device 2 and on the station of the occupation or loading of the converyor belt. It should be noted that there is not a requirement for an inward transfer of identical card modules in a contiguous sequence.

For the described production method, it is necessary to provide every card module with a type- and unit-associated identification number. This number is preferably directly applied either to the printed circuit board, to a component, for example, plug strip, which is present at every card module or, to a workpiece carrier and the identification member must be automatically recognizable. A label with a bar code which is captively united with the card module is, for example, available for this purpose.

In the following processing stations, which include automatic assembly units, manual assembly units or locations and a testing station or unit, repeatedly required, identical production devices are combined to form so-called cells. The transport within a cell occurs by means of a flexible conveyor system which is supplied from a preceding or input storage buffer magazine by means of a programmable handling device and the conveyor discharges the card modules into a cell buffer or handling device for the next following cell after the corresponding work contents have been completely accomplished.

The various component types of the same kind of component such as axial components in this case are always disposed at the same magazine position at the individual processing stations, for example, an automatic assembly unit for axial components. When an assembly mistake, which is perceived as such by the processing station and displayed occurs, the repetition of the precisely same assembly step can be initiated by a manual operation. It is thereby assured that the work content provided at a station is always 100% complete before the module leaves the processing station. A reorganization of the magazine occupation is undertaken only at greater time intervals given a major change in the type/item of the printed circuit board being processed. These changes are recognizable on the basis of dislocations in the ABC analysis of the component requirements.

The flexible conveyor system, which connects all processing stations to one another, is designed such that the input of every individual station can be selected from the cell input and every other station can be selected from the output of every station. This means that opposite travel paths on suitably connected conveyor belts are also possible within the cell which allow overtaking events to be realized when this is necessary for a uniform work load of the individual processing stations. This flexibility makes extremely high demands on the performance capability of the conveyor system in order to guarantee a material flow which does justice to the respectively current cell situation in view of the fast throughput and uniform station load. For the coordination of these types of jobs, the repeated identification of the card module of the conveyor system is required for, on the one hand, route selection and, on the other hand, in front of the processing station for the allocation of the type of associated work program so that all activities are recorded in data direct traffic in the cell computer or, respectively, the conveyor computer. Over and above this, fixed priority rules see to it that the card modules within a cell whose work/conveying content do not optimally fit into the current material flow pattern are nonetheless recognized after a certain number of "applications" and are further processed.

After the complete processing of the automatic assembly event, the card modules are then transferred via the above-described conveyor system into a production cell of manual assembly stations. All components that cannot be automatically plugged into the circuit board are disposed at assigned locations in these manual assembly stations in a comparable fashion. The pre-equipped card modules are directed on a conveyor system by means of the cell computer and conveyor computer to all of the manual assembly stations at which component types which are required for these types of card modules are disposed. As a rule, the card module will therefore be presented to a plurality of manual assembly locations in order to complete the assembly or all components necessary for the particular module. The type-associated assembly programs and components or parts are also made available by the cell computer at the manual assembly locations on the basis of a card module identification number or information.

Resupplying the required components to the automatic assembly units and the manual assembly locations is undertaken in a purely use-controlled fashion during the active production time. When the individual programmable minimum stock has been reached at a component magazine, suitable warning signals for the magazine are activated so that the time required for the restocking event is observed. This prevents a running-out or exhausting a supply of components at any one station.

The suppying event occurs parallel. This means that the supplying event occurs without any interruption of the active production operation so that there is no time loss due to "a supplying or restocking operation".

After the conclusion of the complete assembly, all card modules proceed via a common soldering line in order to be deposited at the end thereof into a cell buffer storage of the testing cell. The operations as in the above-described processing cells are analogously repeated in the testing cell. Card modules recognized as faulty are thereby transferred out of the appertaining testing station into a repair station in which the fault-locating and repair are undertaken. After execution or a repair, the card module returns to the appertaining testing station at a suitable place. Only after the functionability of a card has been completely tested will the card module depart the testing cell. This departure from the testing cell is acknowledged in the master computer and indicates that the card is available for further processing.

Card modules judged irreparable are resupplied into the production system as additional consumption. After suitable availability checks which include all parts and components present, the start job is released.

The data available in the production process are acquired in MDA systems (machine data acquisition) in order to recognize system- or product-associated weak links and designationally eliminate these weak links.

Although various minor modifications may be suggested by those versed in the art, it should be understood that we wish to embody within the scope of the patent granted hereon, all such modifications as reasonably and properly come within the scope of our contribution to the art.

We claim:

1. A method of automatically assembling components on a printed circuit board to form an electronic card module and testing the card module, said method comprising the steps of providing a plurality of different processing stations for assembly of different components at different locations on a circuit board and for soldering the different components to the circuit board, retrieving a specific printed circuit board type from a printed circuit board storage having several types in response to a command signal, reading an identification code on the circuit board to obtain information concerning the type of board, and then in response to the information obtained, conveying the circuit board through selected processing stations of the plurality of stations for assembling selected components on the circuit board and for soldering the selected components on the circuit board to form an electronic card module, and then conveying the card module to a testing station for testing the card module in response to the information obtained during the reading of the identification code, the step of testing including the steps of fault-locating and repairing located faults as necessary.

2. A method according to claim 1, wherein the step of retrieving is a manual retrieving in response to information provided on an information screen of a computer terminal and said step of reading includes passing a read pen for a bar code over a bar code disposed on the printed circuit board.

3. A method according to claim 1, wherein the step of retrieving comprises sending command signals to a mechanical handling device to retrieve a selected circuit board from the storage device.

4. A method according to claim 1, wherein said step of providing a plurality of different processing stations provides work stations arranged in cells of associated work stations, each of said cells having a cell computer means for controlling the operations therein, and a master computer controlling the operations of each of the cell computer means, said method including the further steps of reporting progress of work load status for the work stations of each cell by the cell computer means to the master computer, and said master computer controlling the rate of removal of the printed circuit boards from a storage system to the cell and changing the speed of operation for the work stations in each cell by sending instructions to the cell computer means.

5. A method of automatically assembling components on a printed circuit board to form an electronic card module and testing the card module, said method comprising the steps of providing a plurality of processing stations with technologically identical processing stations being arranged in a cell with each cell having an associated conveyor system for transporting circuit boards between the stations of the cell, conveyor computer means associated with each cell for controlling the operation of the conveyor system, cell computer means for each cell controlling the operation of the conveyor computer means, and the operation of each of the individual processing stations of the cell in accordance to a type-associated work program; retrieving a specific printed circuit board type from a printed circuit board storage having several types in response to a command signal; reading an identification code on the circuit board to obtain information concerning the type of board; and then in response to the information obtained, conveying the circuit board through selected processing stations for assembling of compoenents on the circuit board, for soldering the components on the circuit board to form an electronic card module and then for testing the card module in response to the information obtained during the reading of the identification code, the step of testing including the steps of fault-locating and repairing located faults as necessary and the step of conveying through selected processing stations including supplying the individual printed circuit boards to the individual processing stations in response to control signals from the conveyor computer means and the cell computer means, and controlling the operation of the selected processing stations in response to the particular type of circuit board being processed to perform the operation at the selected processing stations.

6. A method according to claim 5, wherein the step of providing the plurality of stations in cells provides a conveying system between associated cells, said method including operating the conveying systems to transfer individual card modules emerging from the processing stations of one cell to the input or the next following processing cell.

7. A method according to claim 5, which includes reading devices associated with each conveyor system of a cell and said method includes scanning a circuit board on the conveying system of the cell with the reading devices to transfer information to the cell computer means and the conveyor computer means, said computer means for the cell being connected to a master computer means for the entire system, said computer means coacting for controlling the converging of the various circuit boards between the processing stations of the cell and to select the next destination after completing the processing at a given station.

8. A method according to claim 7, wherein the conveyor computer means after completion of work operation at a processing station detects the removal of the circuit board from said station, reports this removal to the cell computer means and said computer means identify the next destination within the cell for the type-associated work program and operate the conveyor to move the circuit board to the next cell.

9. A method according to claim 8, which includes scanning the circuit board being conveyed past given positions and controlling the operation of the conveyor system for the circuit board in response to the read information obtained by the scanning.

10. A method according to claim 9, wherein each cell has a buffer storage at the input end of the conveyor system and a buffer storage at the output end, said method including in unloading circuit boards from the buffer storage at the input end and placing the unloaded board in the conveyor system of the cell and loading finished circuit boards from the conveyor system to the buffer storage at the output end.

11. A method of automatically assembling components on a printed circuit board to form an electronic card module and testing the car module, said method comprising the steps of providing a plurality of work stations arranged in cells of associated work stations, each of said cells having a cell computer means for controlling the operations therein, and a master computer controlling the operations of each of the cell computer means, said master computer being electrically connected to a further higher ranking computer, said master computer receiving a list of card modules to be produced and providing answerbacks regarding completed jobs, standstill times and component comsumption; retrieving a specific printed circuit board type from a printed circuit board storage having several types in response to a command signal; reading an identification code on the circuit board to obtain information concerning the type of board; then in response to the information obtained, conveying the circuit board through selected work stations of selected cells for assembling of components on the circuit board and for soldering the components on the circuit board to form an electronic card module and then testing the card module in response to the information obtained during the reading of the identification code, the step of testing including the steps of fault-locating and repairing located faults as neessary, said step of conveying including reporting progress of work load status for the work stations of each cell by the cell computer means to the master computer, and said master computer controlling the rate of removal of the printed circuit boards from a storage system to the cell and changing the speed of operation for the work stations in each cell by sending instructions to the cell computer means.

12. A method according to claim 11, wherein the master computer identifies the load supplied to each of the individual work stations, identifies the loads from the quantity of card modules to be produced during a predetermined time span on the basis of a list of a production time spans, for every type or card module to be produced and calculates the sequence of card modules to be produced according to the principle of maximal frequent-type change with regard to an optimum uniform loading of the work stations as well as the shortest possible transit time for the total production time span.

13. A system for assembling components on a circuit board to form electronic card modules, and for testing the various circuits of the electronic card modules, said system comprising means for retrieving a specific printed circuit board from a printed circuit board storage having several types of printed circuit boards; means for reading an identification code on the circuit board to obtain information concerning the type of board; a plurality of processing stations including stations for assembling components on the circuit board, stations for soldering the components on the circuit board to form an electrical card module, and stations for testing the card module; said processing stations having technically identical processing being combined in cells, each cell having cell computer means for controlling the operation of the processing stations of the cell, cell conveyor means for transporting circuit boards between the various stations of the cell, and conveyor computer means for controlling the operation of the cell conveyor means; conveyor means for transporting the circuit boards between the various cells; and master computer means for controlling the operation of each of the stations and the conveyor means between the cells in response to said information, said stations for testing the card including at least one station having both fault-locating capabilities and fault-repairing capabilities.

14. A system according to claim 13, wherein each of the individual cells of processing stations are interconnected by a mechanical conveyor system for receiving the output from the cell and transporting it to the input of the next following cell.

15. A system according to claim 13, each of the cell conveyor means includes means for identifying individual circuit boards entering the cell, said cell computer means receiving the information from the means for identifying and creating a signal to the master computer means to obtain a type-association work program for the particular circuit board; said cell computer means from the work program determining the processing station of the cell to be selected as the next destination for the circuit board, and commanding the conveyor computer means to operate the conveyor means to transport the circuit board to the next destination.

16. A system according to claim 15, wherein at the conclusion of procession of a circuit board at a processing station, said conveyor computer means detects the ejection of the circuit board from the station, reports this to the cell computer means, said cell computer means determining the next destination for the circuit board in the cell and provides command signals to the conveyor computer means to transport the circuit board to its next destination.

17. A system according to claim 16, wherein the conveyor means includes automatic scanners for reading information on a circuit board being transported by the conveyor means, said scanners creating a signal to provide the information to the cell computer means, said cell computer means and conveyor computer means providing command signals to switch the circuit board to the desired path in the conveyor means for the cell to obtain transfer of the board to the desired processing station of the cell.

18. A system according to claim 17, which includes a buffer storage device arranged at the input end of each of the cells and at the output end of each of the cells to provide a temporary buffer in a production flow of circuit boards to the cell and from the cell, said conveyor means including means for taking individual circuit boards from the buffer storage at random access and supplying them to conveyor means for transport to the processing stations within the cell.

* * * * *